United States Patent [19]

Watanabe

[11] 4,125,878
[45] Nov. 14, 1978

[54] MEMORY CIRCUIT

[75] Inventor: Hiroshi Watanabe, Tokyo, Japan

[73] Assignee: Nippon Electric Co., Ltd., Tokyo, Japan

[21] Appl. No.: 814,849

[22] Filed: Jul. 11, 1977

[30] Foreign Application Priority Data

Jul. 12, 1976 [JP] Japan ................... 51-82693

[51] Int. Cl.$^2$ ............................................. G11C 11/40
[52] U.S. Cl. ............................ 365/208; 365/186; 365/202; 307/238
[58] Field of Search ..... 340/173 R, 173 CA, 173 FF; 307/238, 279; 365/186, 203, 205, 202, 210, 207, 208

[56] References Cited

U.S. PATENT DOCUMENTS 3,760,381  9/1973  Yao ................................ 340/173 SF

Primary Examiner—Terrell W. Fears
Attorney, Agent, or Firm—Hopgood, Calimafde, Kalil, Blaustein & Lieberman

[57] ABSTRACT

A memory circuit including one-transistor-per-bit memory cells arranged in a matrix array of $m$ and $n$ columns, one capacitor, and $n$ differential amplifiers associated with the $n$ respective column. The memory array is divided into first and second row groups and each differential amplifier has a first input terminal connected to memory cells belonging to the first row group and associated with one of the $n$ columns and a second input terminal connected to memory cells associated with the second row group and connected to the same column that is connected to the first terminal. The memory circuit also includes an output amplifier having two input terminals, a plurality of first and second switching means associated with respective columns and controlling means for controlling the first and second switching means. The first and second switching means, associated with the same column may be selected and controlled by the same controlling means.

6 Claims, 10 Drawing Figures

MEMORY CIRCUIT

FIELD OF THE INVENTION

This invention relates to memory circuits using insulated-gate field-effect ransistors, and more particularly to memory circuits utilizing one-transistor-per-bit memory cells.

DESCRIPTION OF THE PRIOR ART

In a memory circuit utilizing one transistor and one capacitor as a memory cell, the read-out signal from the memory cell is generally of such a low level that a high sensitivity amplifier is required. In a memory system utilizing a one-transistor-per-bit memory cells, the memory cell output signal is supplied to an output circuit, and then amplified by two stage differential amplifiers, as shown in the "Digest of Technical Papers" of the ISSCC 1975, PP. 102–103. In this circuit, the first stage amplifier is referred to as a sense amplifier, and each of the first stage amplifiers, connected to each column of a memory cell matrix array, amplify the information signal read out from selected ones of the column cells. The output signal is then supplied to an input/output (I/O) bus line. The signal fed to the I/O bus line is next fed to one input of a second stage output differential amplifier. The other input of the output amplifier is supplied with a reference voltage, and the reference voltage and the input signal are differentially amplified and supplied to an output circuit.

With the circuit of the aforesaid arrangement, one input of the output amplifier is supplied with a reference voltage, so that difficulties are encountered in determining the reference voltage as will be detailed hereinafter. In addition, there are certain limitations in the selection of the timing for activating the output amplifier and a certain period of time is required before the output amplifier is activated, which results in the operation of the memory circuit being considerably slower than desired.

Moreover, in a memory circuit as shown in U.S. Pat. Nos. 4,003,035 and 4,004,285, the output signal of the first stage sense amplifier is fed to a single output terminal, and hence, when the output signal is amplified by the second stage output differential amplifier, the output signal, fed to the single output terminal, is applied to only one input of the output amplifier, while the other input of the output amplifier is supplied with a reference voltage. Accordingly, the disadvantages mentioned above are also encountered in these circuits.

It is therefore an object of this invention to provide a memory circuit capable of operation without requiring a reference voltage as an input for the output amplifier.

It is another object of this invention to provide a memory circuit capable of high speed operation.

SUMMARY OF THE INVENTION

The memory circuit according to the present invention comprises one-transistor-per-bit memory cells arranged in a matrix array of $m$ rows and $n$ columns, one capacitor, and $n$ differential amplifiers associated with the $n$ respective columns. The memory array is divided into first and second row groups. Each differential amplifier has a first input terminal connected to memory cells associated with the first row group and one of the $n$ columns, and a second input terminal connected to memory cells associated with the second row group and to the same column that is connected to the first terminal. In addition, the memory circuit includes an output amplifier having two input terminals, a plurality of first and second switching means associated with respective columns, and controlling means for controlling the first and second switching means. One of the first switching means connects the first input terminal of one of the differential amplifiers to one input terminal of the output amplifier. Similarly one of the second switching means, associated with the same column as that column belonging to the one of the first switching means, connects the second input terminal one of the differential amplifier to the other input terminal of the output amplifier. In addition, the first and second switching means associated with the same column may be selected and controlled by the same controlling means.

It is a feature of the invention that a differentially amplified output, i.e., a pair of complementary signals from the differential amplifier connected to a selected memory cell, is impressed on both of the input terminals of the output amplifier, and therefore the reference voltage used in the prior art circuits described above can be eliminated. The result is freedom from the disadvantages inherent in the prior art circuits discussed above.

Further objects, features and advantages of the invention will become more apparent from the following description taken in conjunction with the accompanying drawings.

DETAILED DESCRIPTION

Figure 1:
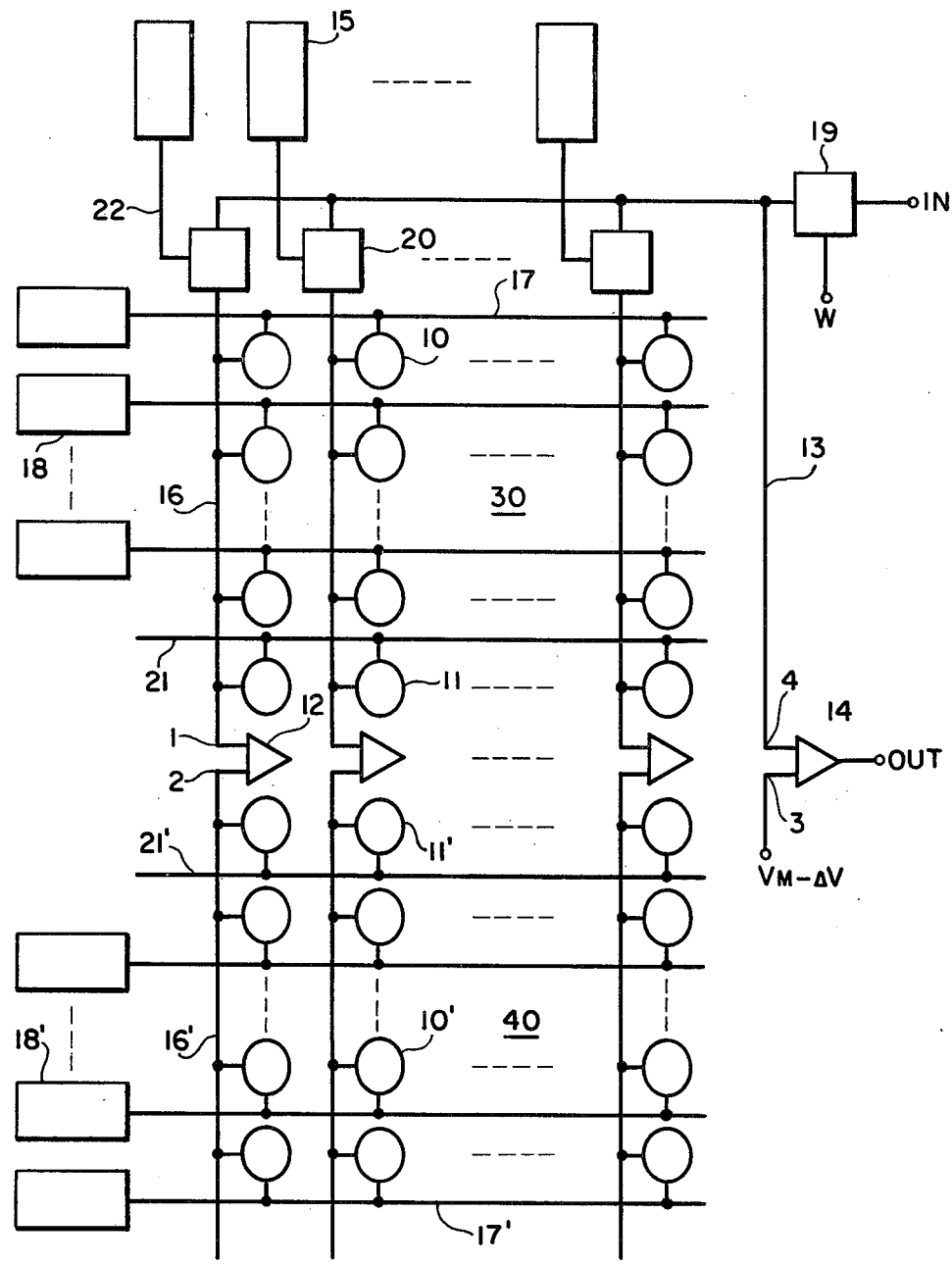
FIG. 1 illustrates a block diagram of a conventional memory circuit.

Referring now to FIG. 1, there is shown, in block diagram form, a prior art memory system comprised of one-transistor-per-bit type memory cells arranged in a 64 × 64 bit array, that is, in a square array of 64 rows and 64 columns. The memory cell array is divided into first and second groups 30 and 40, each of which contain 32 row lines, such as word lines 17 and 17', respectively. Also included are 64 differential differential amplifiers 12, i.e. sense amplifiers, having their two inputs 1 and 2 supplied with signals from the column lines, i.e. bit lines 16 and 16' belonging to the first and second row groups 30 and 40, respectively. Also included are 64 × 32 one-transistor memory cells 10, provided at the intersections of bit lines 16 and the word lines 17 in the first row group 30. In a like manner, 64 × 32 memory cells 10' are provided at the intersections of the bit lines 16' and the word lines 17' in the second row group 40. Connected to the word lines 17 in the first row group 30 are respective row address decoders 18. Also connected to the word lines 17' in the second row group 40 are respective address decoders 18'. Each bit line 16 is connected through a switching gate 20 to the input/output bus 13 (I/O bus). The respective switching gates 20 are placed in an ON or OFF state by 64 column address decoders 15. An output amplifier 14 has one input terminal 4 connected to the I/O bus 13, and another input terminal 3 supplied with a reference voltage ($V_M - \Delta V$). A write signal IN is supplied to the I/O bus 13 through write gate 19 which is controlled by a write timing signal W. Sixty-four dummy cells 11 are provided at the respective intersections of bit lines 16 and selecting lines 21. Likewise, 64 dummy cells 11' are provided at the respective intersections of bit lines 16' and selecting lines 21'. These dummy cells are used for generating a reference voltage for the sense amplifiers 12.

Information contained in one memory cell 10, selected by the row decoders 18 and the column decoders 15, emerges at the bit line 16, to which the selected memory cell belongs. The bit line 16 is connected to the I/O bus 13 through the switching gate 20 which has been turned ON by the decoder 15. As a result, the selected memory cell information is supplied through the I/O bus 13 to one input 4 of the output differential amplifier 14. In this case, when one of row lines 17, belonging to the first row group 30, is selected by the row decoder 18, dummy cell 11', belonging to the second row group 40, is also selected at the same time by a signal on selecting line 21'. Similarly when one of row lines 17', belonging to the second row group 40, is selected by row decoder 18', dummy cell 11, belonging to the first row group 30, is also selected at the same time by a signal on selecting line 21. As has been described above, when one of the memory cells belonging to the first row group 30 is selected, the potential on the selected bit line 16, which is applied to input 1 of the sense amplifier 12, is dropped to a low level if the information in the selected memory cell 10 is at a low level. In the case where the cell information is at a high level, the aforesaid potential on bit line 16 only drops slightly. At the same time, the potential on the bit line 16', which is applied to input 2 of the sense amplifier 12, drops a small degree below the initially potentially set by the dummy cell 11', belonging to the second row group 40. Simultaneous with the energizing of amplifier 12, the potential difference between the bit lines 16 and 16' is amplified by the amplifier 12. The amplified output is then fed to the I/O bus 13 through the selected bit line 16 and the switching gate 20 connected to the bit line 16. Next, the amplified output is applied to input 4 of the output amplifier 14 for comparison with the reference voltage applied to the other input 3. The resultant difference voltage is amplified by the amplifier 14 and supplied to an output circuit (not shown).

Figure 2:
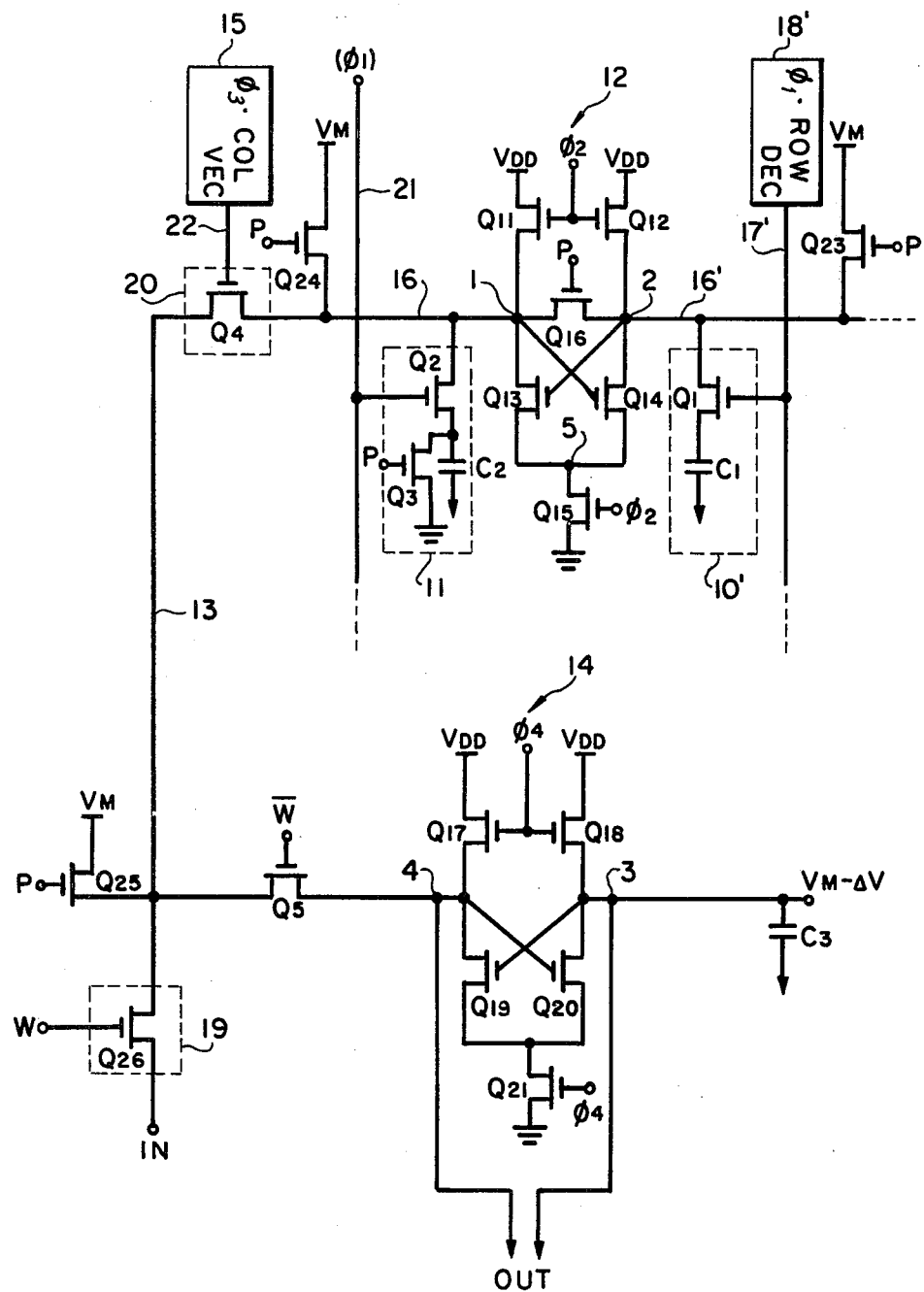
FIG. 2 is a circuit diagram showing a portion of the block diagram of FIG. 1

FIG. 2 shows a circuit diagram illustrating part of the memory circuit of FIG. 1. The same component elements are designated by the identical reference numerals in FIGS. 1 and 2. Transistors used in this circuit are N-channel type MOS transistors, and will be referred to simply as MOST's hereinafter. Memory cell 10', belonging to row group 40, is connected to the bit line 16' as well as to input terminal 2 of the differential amplifier 12. The memory cell 16' consists of a MOST $Q_1$ and a capacitor $C_1$, with the source of MOST $Q_1$ being connected through capacitor $C_1$ to a given potential, such as for instance, ground potential. The drain of the MOST $Q_1$ is connected to the bit line 16' and its gate is connected to the word line 17'. Dummy cell 11, belonging to the first row group 30, is connected to bit line 16 and input 1 of the amplifier 12. The dummy cell 11 consists of MOST's $Q_2$ and $Q_3$ and a capacitor $C_2$. The source of the MOST $Q_2$ is connected through the capacitor $C_2$ to a given potential, i.e., ground potential, its drain is connected to the bit line 16, and its gate is connected to the selecting line 21, to which is supplied a timing signal $\phi_1$.

A timing signal P is supplied to the gate of the MOST $Q_3$, ground potential is applied to the source thereof, and the $Q_3$ drain is connected to the source of MOST $Q_2$. The I/O bus 13 is connected to the bit line 16 through a MOST $Q_4$ which comprises switching gate 20. Gate 20 is energized by an output of the column decoder 15, which output is generated in response to a timing signal $\phi_3$. The I/O bus 13 is also connected to one input 4 of the output amplifier 14 through a MOST $Q_5$ energized by a signal $\overline{W}$ which is opposite is polarity to that of the write timing signal W. The reference voltage ($V_M - \Delta V$) is applied to input 3 of the output amplifier by the capacitor $C_3$ connected to the node 3. The potential difference between the inputs 3 and 4 of amplifier 14, includes the information stored in the memory cell 10', and this information is supplied to an external output circuit.

The amplifier 12 is comprised of switching MOST's $Q_{13}$, $Q_{14}$ and load MOST's $Q_{11}$ and $Q_{13}$. The MOST's $Q_{13}$, $Q_{14}$ have their gates connected to their drains, respectively, as well as to nodes 1 and 2 of amplifier 12. The sources of the MOST's $Q_{11}$ and $Q_{12}$ are commonly connected at node 5 and grounded through MOST $Q_{15}$. MOST's $Q_{11}$, $Q_{12}$, $Q_{15}$ receive, at their gates, timing signal $\phi_2$ which energizes the amplifier 12. A MOST $Q_{16}$ is connected between the nodes 1, 2, and its gate is supplied with the timing signal P. The nodes 1, 2 are connected through MOST's $Q_{11}$, $Q_{12}$ to a power source $V_{DD}$.

The output amplifier 14 includes switching MOST's $Q_{19}$, $Q_{20}$ and load MOST's $Q_{17}$, $Q_{18}$. The gates of MOST's $Q_{19}$ and $Q_{20}$ are connected to their drains, as well as to nodes 3 and 4 of amplifier 14 respectively. In addition, the sources of MOST's $Q_{19}$, $Q_{20}$ are both grounded through MOST $Q_{21}$. MOST's $Q_{17}$, $Q_{18}$, and $Q_{21}$ receive at their gates a timing signal $\phi_4$ which energizes the amplifier 14.

The power source $V_M$ is connected through MOST's $Q_{23}$, $Q_{24}$, $Q_{25}$ to the bit lines 16, 16' and I/O bus 13, respectively. A timing signal P is supplied to the gates of MOST's $Q_{21}$, $Q_{24}$, $Q_{25}$. The timing signal P is initially at a high level. MOST's $Q_{16}$, $Q_{23}$, $Q_{24}$, $Q_{25}$ become conductive in response to timing signal P, thereby precharging the respective nodes 1, 2, 4 to the $V_M$ level. This level is lower than a logic level "1", but higher than the logic level "0" of information stored in the memory cell. When the timing signal $\phi_1$ rises to a high level, information stored in the memory cell 10', selected by row decoder 18', is read out onto the bit line 16'. In other words, the charge stored in capacitor $C_1$, associated with memory cell 10', is transferred through MOST $Q_1$ to parasitic capacitance associated with node 2, so that the potential at the node 2 will vary to some extent. A signal stored in dummy cell 11, which has been selected by the same timing signal $\phi_1$, remains at the "0" level due to MOST $Q_3$ whose gate receives a timing signal P, so that the potential at the node 1 is lowered to same extent. The capacitance of capacitor $C_2$ for the dummy cell 11, is chosen so that the potential variation at the node 1, by the dummy cell 11, is smaller than the potential variation at the node 2, by the memory cell 10', when information stored in memory cell 10' is at the "0" level.

A minor potential difference between the nodes 1 and 2 is amplified by the amplifier 12 which is energized by the timing signal $\phi_2$. The signal thus amplified is fed through the MOST $Q_4$ to the I/O bus 13 in response to timing signal $\phi_3$. The signal level of I/O bus 13 is transferred to the node 4 by the MOST $Q_5$ which remains conductive at the time of a read operation. A potential difference between the nodes 3 and 4 is amplified by the sense amplifier 14 energized by the timing signal $\phi_4$. As a result, the output thus amplified is supplied to an output circuit. The MOST $Q_5$ disconnects amplifier 14 from I/O bus 13 at the time of a write operation.

Figure 3:
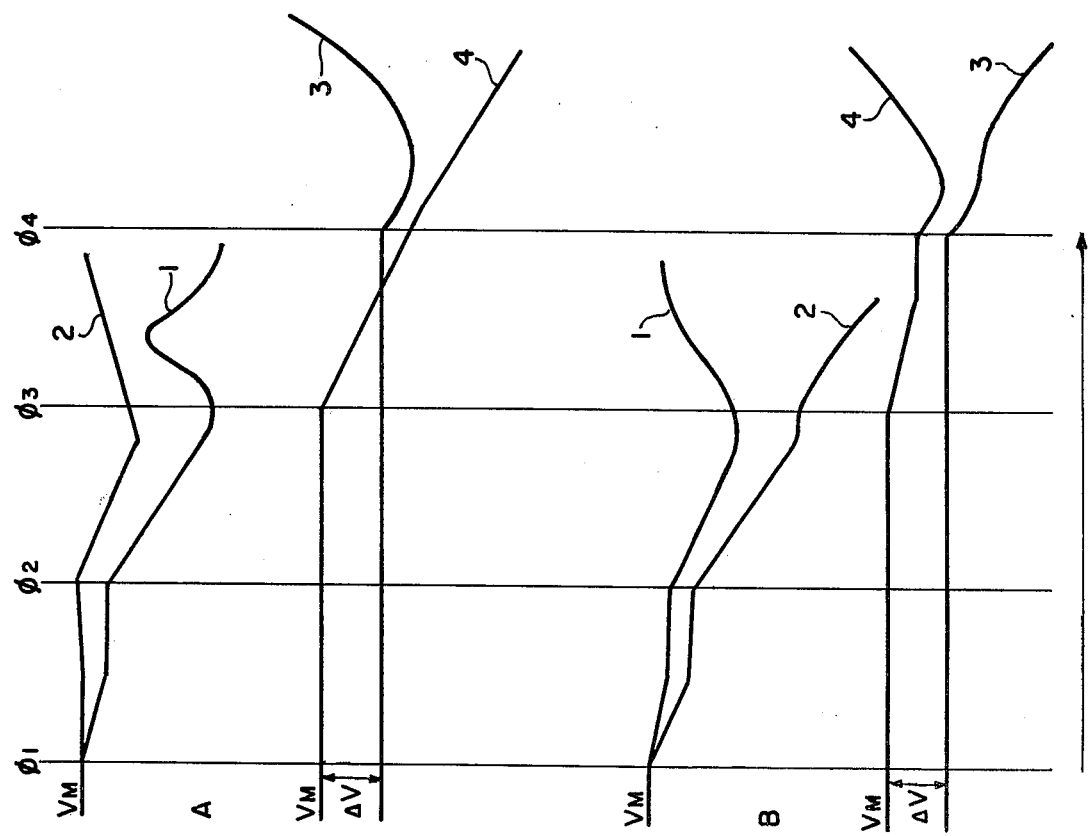
FIG. 3 is a waveform diagram illustrative of the operation of the circuit of FIG. 2

FIG. 3 shows waveforms present at nodes 1, 2 and the nodes 3, 4, at times $\phi_1$ through $\phi_4$. The reference numerals 1 through 4 represent potential variations at the modes 1 through 4. Assume that the information in a memory cell 10' is at a level "1". In this case the potential at node 2, as shown in FIG. 3A, rises slightly above the initial level $V_M$ after the timing signal $\phi_1$ has been applied due to the high level of the information stored in the memory cell 10'. The potential at node 1 is lowered to some degree below the initial level $V_M$ due to the low level of the information stored in the dummy cell 11. The potentials at the nodes 1, 2 are lowered, because these potentials are high enough to render the MOST $Q_{14}$, $Q_{13}$ conductive in response to the application of timing signal $\phi_2$. In fact, since the potential at the node 1 is lower than that at the node 2, when the timing signal $\phi_2$ is applied, the transconductance gm of the MOST $Q_{14}$ is smaller than that of the MOST $Q_{13}$. In other words, the potential at the node 1 drops faster than that at the node 2, and as a result, the decrease in potential at the node is interrupted at a halfway point. The bit line 16, selected by the column decoder 15, is connected to the I/O bus 13 by the in response to timing signal $\phi_3$. The I/O bus 13 has been raised to the $V_M$ level in response to the signal P before the application of the signal $\phi_1$. Therefore a potential level at the I/O bus 13 is transferred to the node 1, thereby raising the potential thereat. However, the potential at node 1 is still lower than that at the node 2, so that a potential difference between the nodes 1 and 2 is amplified according to the positive feedback function of the flip-flop type amplifier 12. Accordingly, the I/O bus 13 is brought to a low level. The potential at the node 4 is lowered due to the low level of the I/O bus 13 in response to the timing signal $\phi_3$. The output amplifier 14 is energized by the timing signal $\phi_4$, after the potential at the node 4 has been lowered to a level lower than the reference voltage ($V_M - \Delta V$) at the node 3, which is the other input of the output amplifier 14.

While, as shown in FIG. 3B, when information stored in the memory cell 10' is at the "0" level, the potential at node 2 is lowered than that at the node 1, after the application of the timing signal $\phi_1$. This is because the capacitance of capacitor $C_1$, in the memory cell 10', is larger than that of the capacitor $C_2$ in the dummy cell 11. Accordingly, the potential at the node 2 drops faster than that at the node 1 due to the application of the timing signal $\phi_2$. Due to the application of the signal $\phi_3$, the bit line 16 is connected to the I/O bus 13, and the potential at the node 1 rises. A rise in potential at the node 1 after the application of the signal $\phi_3$ is attributable to the charge-transfer from the I/O bus 13. As a result, the potential at the node 4 after the application of the signal $\phi_3$ is lowered to a degree corresponding to the aforesaid charge transfer. The potential level thus reached at the node 4 should be higher than the initial level ($V_M - \Delta V$) at "0" node 3.

As is clear from FIG. 3, the initial level ($V_M - \Delta V$) at the node 3 should be sufficiently lower than that at the node 4, when the information in the memory cell 10' is at the "0" level. On the other hand, when the cell information is at the "1" level, then the level at the node 3 should be high i.e., at a level approximating the potential $V_M$. Accordingly, difficulties arise in determining an initial level for node 3. In addition, the application of the timing signal $\phi_4$, for energizing the amplifier 14, should be sufficiently delayed behind timing signal $\phi_3$.

Referring again to FIG. 2, a write operation after a read operation will be considered. Assume that when the potential at node 2, after the read operation, is sufficiently low, and the potential at the node 1 is sufficiently high by the MOST $Q_{11}$, a low level information signal is written into the cell from the terminal IN through the MOST $Q_{26}$. The potential at the node 1. drops to a lower level, so that the MOST $Q_{14}$ becomes non-conductive. The potential at the node 2 rises to a high level by the MOST $Q_{12}$. Accordingly, unless the transconductance Gm of the MOST $Q_{12}$ is sufficiently large, the width of a write pulse W (i.e., the conduction duration of the MOST $Q_{26}$) must be increased, causing the write operation cycle to be extended. On the other hand, if the write pulse width is reduced by reducing the transconductance of the MOST $Q_{12}$, then power consumption is increased in the differential amplifier 12.

Assume that a high level information signal is written into the memory cell, from the terminal IN, when the potential at the node 1 drops to a low level after the read operation. In this case, the MOST $Q_{13}$ remains conductive, and hence a high potential can not be acheived at the node 1, unless the resistance of bit line 16 is sufficiently small.

Figure 4:
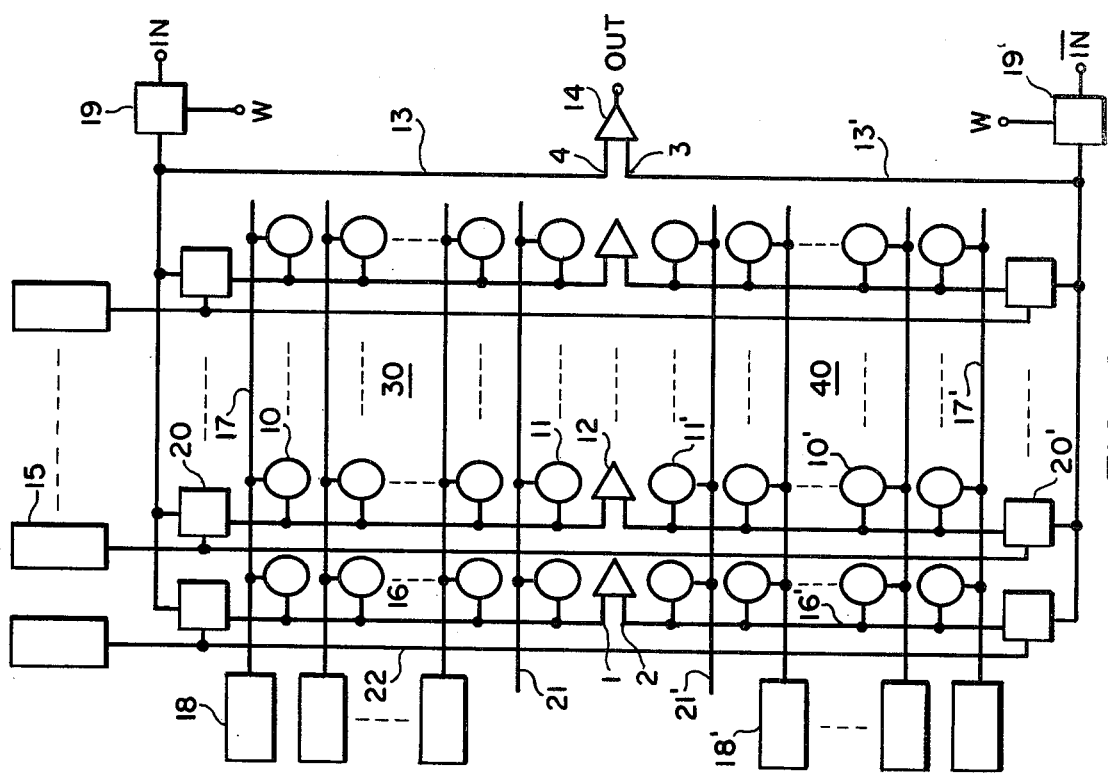
FIG. 4 is a block diagram of one embodiment of the invention

FIG. 4 shows a block diagram of one embodiment of the invention, which advantageously avoids the shortcomings in the prior art memory circuits as described in conjunction with FIGS. 1 through 3. The same component elements are indicated by the identical reference numbers in FIGS. 1 and 4. The memory circuit, as in FIG. 1, is comprised of memory cells of the one-transistor-per-bit type, and the memory cells are arranged in a 64 × 64 bit array. The memory cell array is divided into first and second row groups 30 and 40. Elements included in FIG. 4, which were not included in FIG. 1 are 64 switching gates 20', and I/O bus 13'. The gates 20' connect corresponding bit lines 16' to I/O bus 13'. The respective gates 20' are connected to output lines 22 of column decoders 15, in the column, with which gates 20' are associated. Gates 20 are controlled by an output of the column decoder 15, along with the switching gates 20. In addition, there is provided a write transfer gate 19', connected to the I/O bus 13', and the gate 19' is controlled by a write timing signal W and supplied with an external write signal $\overline{IN}$. The write signal $\overline{IN}$ is complementary to write signal IN to be applied to the other write transfer gate 19. The I/O bus 13' is connected to the other input 3 of the amplifier 14. The remainder of the circuit arrangement in FIG. 4 is the same as that in the circuit of FIG. 1.

The information in memory cell 10, belonging to the first row group selected by the column decoder 15 and row decoder 18 is read out on the bit line 16, to which the aforesaid memory cell 10 is associated. At the same time, the dummy cell 11, belonging to the second row group 40, is selected by a signal on the selecting line 21'. As has been described earlier, the potential on bit line 16', on the same column as that of the bit line 16, and by the dummy cell 11', will vary. Accordingly, when the amplifier 12 is energized, a potential difference between the bit lines 16, 16' is amplified by the amplifier 12. Thus, one of the differential outputs on the selected bit line 16 is transferred to the input 4 of the amplifier 14 through the switching gate 20 which has been made conductive by the column decoder 15. On the other hand, the other of differential outputs, appears on the bit line 16' in the same column as that of the bit line 16. Switching gate 20', connected to the bit line 16', remains conductive due to column decoder 15, so that an output on the bit line 16' is transferred to the other input 3 of the amplifier 14 through the I/O bus 13'. Accordingly, a differential signal is achieved for the two inputs of the amplifier 14, thereby dispensing with the use of the reference voltage ($V_M - \Delta V$) required in the prior art circuit of FIG. 1.

Figure 5:
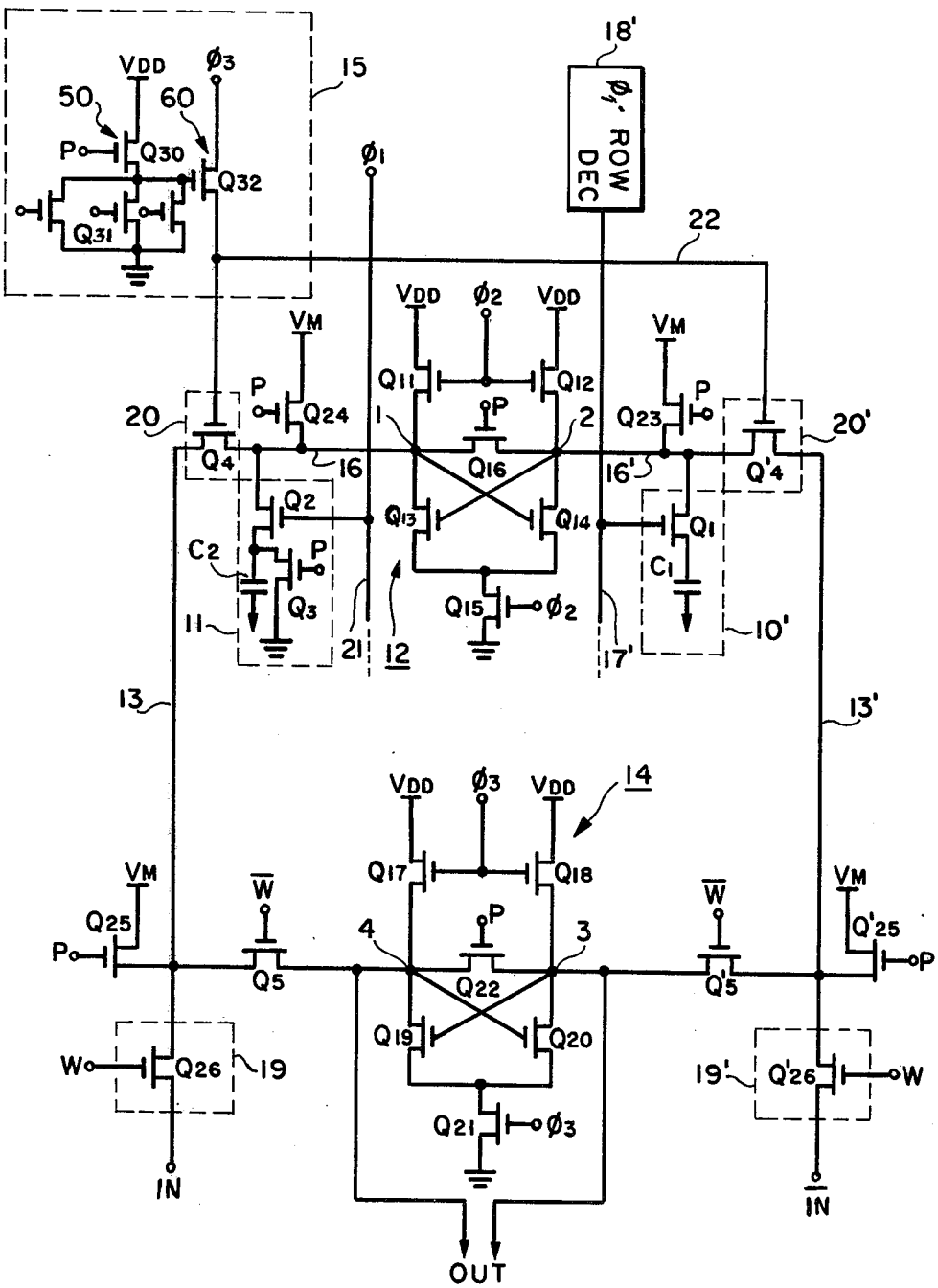
FIG. 5 is a circuit diagram showing part of the block diagram of FIG. 4

FIG. 5 shows part of the circuit of FIG. 4. The same component elements are indicated by identical reference numericals in FIGS. 2 and 5. The bit line 16', connected to input 2 of the amplifier 12 is connected to the I/O bus 13' through the MOST $Q_4$, which constitutes switching gate 20'. An output 22, of the column decoder 15, which is generated in response to timing signal $\phi_3$, is supplied to the gate of the MOST $Q'_4$. A write transfer gate 19' consists of a MOST $Q'_{26}$, whose gate is supplied with a write timing signal W.

The column decoder 15 consists of a NOR type decoding circuit 50 and an address driver circuit 60. The NOR type decoding circuit 50 consists of a load MOST $Q_{30}$, having a gate supplied with a timing signal P, and 6 MOSTs $Q_{31}$ having their respective gates supplied with true or complementary address signals. The source and drain of each MOST $Q_{31}$ are commonly connected to ground potential and to an output of the NOR type decoding circuit 50, respectively. The output of circuit 50 is connected through a load MOST $Q_{30}$ to a power source $V_{DD}$ as well as to the gate of the MOST $Q_{32}$ which constitutes address driver 60. A timing signal $\phi_3$ is applied to the drain of the MOST $Q_{32}$ and the source thereof is connected to the output of the decoder circuit 15. Outputs of the respective decoders 15 are connected through the line 22 to the respective switching gates 20 as well as to the gates of MOSTs $Q'_4$ which constitute respective gates 20'.

The output amplifier 14 includes switching MOST's $Q_{19}$ and $Q_{20}$ whose gates are connected to the opposite MOST's drains. The drains thereof are connected to nodes 3 and 4 and the sources thereof are commonly grounded through MOST $Q_{21}$. The nodes 3, 4 are connected through load MOST's $Q_{18}$, $Q_{17}$ to the power source $V_{DD}$, respectively. The MOST's $Q_{17}$, $Q_{18}$ and $Q_{21}$ have gates supplied with a timing signal $\phi_3$. The MOST $Q_{22}$ having a gate supplied with the timing signal P is connected between the nodes 3 and 4, thereby equalizing the initial potential levels present at nodes 3, 4. The bit lines 16', 16, and I/O buses 13, 13' are connected to a power source $V_M$ through the MOSTs $Q_{23}$, $Q_{24}$, $Q_{25}$ and $Q'_{25}$, having their gates supplied with the timing signal P, respectively. The remainder of the circuit arrangement, such as differential amplifier 12, memory cells 10, 10', dummy cells 11, 11', word lines 17, 17', and row decoders 18, 18' are the same as those of FIG. 3.

Figure 6:
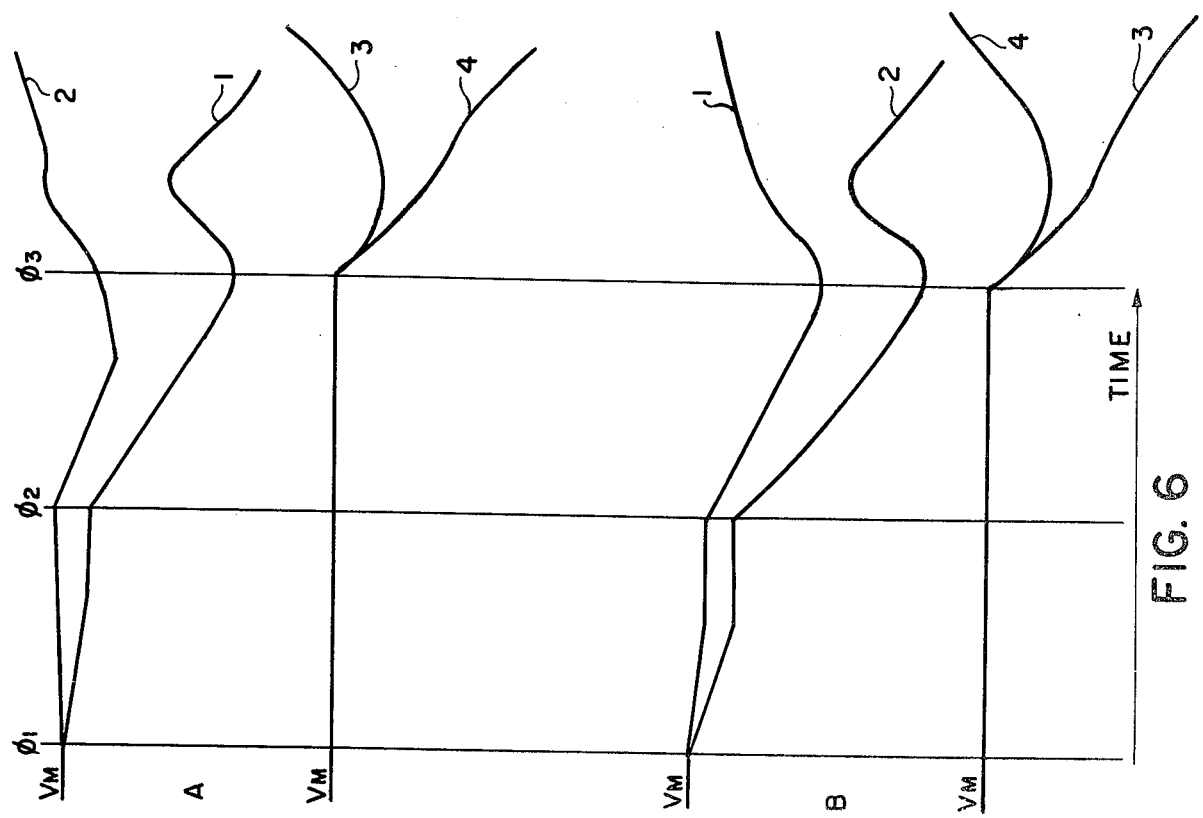
FIG. 6 is a waveform diagram illustrative of the operation of the circuit FIG. 5

FIG. 6 shows the timing waveforms representing the operation of the circuit of FIG. 5. Reference numerals 1 through 4 represent potential variations at the nodes 1 to 4, respectively. Prior through the application of the timing signal $\phi_1$, the nodes 1 through 4 are precharged to the level $V_M$ by the MOST's $Q_{24}$, $Q_{23}$, $Q_{25}$, $Q_{25}$ which become conductive in response to the precharging timing signal P. When the memory cell 10' belonging to the second row group 40, is selected by timing signal $\phi_1$ via row decoder 18', and if the informaton stored in memory cell 10' is at the "1" level, then as shown in FIG. 6A, the potential at the node 2 rises slightly higher than the initial value $V_M$ due to the high potential level of the information stored in memory cell 10'. The potential at node 1, as has been described with reference to FIG. 2, drops to some degree below the initial value $V_M$ due to the information stored in dummy cell 11 belonging to the first row group 30. These potentials are sufficiently high for rendering the MOST's $Q_{13}$, $Q_{14}$ conductive due to the application of the timing signal $\phi_2$, so that the potentials at nodes 1 and 2 drop. In this case, the potential at node 1 is lower than that at node 2, and hence the transconductance gm of the MOST $Q_{14}$ is smaller than transconductance of the MOST $Q_{13}$. Therefore, the potential at node 1 drops faster than the potential at node 2, with the result that the potential at node 1 drops to nearly to the ground potential. The potential at node 2 stops dropping at an approximate halfway point. The bit line 16, selected by the column decoder 15, is connected to the I/O bus 13 in response to timing signal $\phi_3$. At the same time line 16', belonging to the same column as the bit line 16, is connected to the I/O bus 13'. The I/O buses 13, 13' are fixed at the level $V_M$, by the signal P, prior to the application of the timing signal $\phi_1$. Therefore, the charges on the I/O buses 13, 13' are transferred onto the nodes 1, 2, upon the application of the timing signal $\phi_3$, causing the potentials at the nodes 1, 2 to rise slightly. However, the potential at the node 1 is still lower than that at the node 2, and hence a potential difference between the nodes 1, 2 is amplified due to the positive feed back function of the flip-flop type amplifier 12. Accordingly, high and low level information appears on the respective I/O bus lines 13', 13. Input 3 of the amplifier 14 is connected to the I/O bus 13' through the MOST $Q_5'$ which is rendered conductive at the time of the read operation. Input 4 of the amplifier 14 is connected to the I/O bus 13 through the MOST $Q_5$ in a similar manner. As a result, the amplifier 14 amplifies the potential difference between the nodes 3, 4, in conjunction with the application of the timing signal $\phi_3$.

On the other hand, as shown in FIG. 6B, when the information in selected memory cell 10' is at the "0" level, the potential at node 2, as has been described earlier, falls lower than the potential at node 1 subsequent to the application of the timing signal $\phi_1$. Amplifier 12 is activated by the ap- the application of the timing signal $\phi_2$, and amplifier 12 is activated to amplifies the potential difference between the nodes 1 and 2, as the potential at the node 1 is higher than the node 2. Accordingly, the high level signal on the bit line 16, connected to the node 1 at the application of the timing signal $\phi_3$, is transferred to the I/O bus 13 through the switching gate 20 which has been opened by the decoder 15. On the other hand, the low level signal on the bit line 16', connected to the node 2 on the same column as that of the bit line 16, is transferred to the I/O bus 13' through the switching gate 20' which has been opened by the decoder 15. As a result, the potential difference between the nodes 3 and 4 is amplified in conjunction with the application of the timing signal $\phi_3$ by the output amplifier 14.

In this manner, the timing for energizing the output amplifier 14 can be synchronized with the application of the timing signal $\phi_3$, and hence the memory circuit can be operated at a higher speed than the prior art circuit of FIG. 1.

In addition, since a potential difference is necessarily applied across the two inputs 3, 4 of the amplifier 14, the reference voltage $(V_M - \Delta V)$ required in the prior art to be applied to one input of the amplifier 14, is no longer required. A new information signal may be written into the memory cell by introducing complementary signals IN, $\overline{IN}$ through the MOST's $Q_{26}$, $Q_{26}'$, respectively. In FIG. 5, assume that the potential at node 2 is at a sufficiently low level after the read operation, while the potential at node 1 is at a sufficiently high level. For writing a high level information signal into the memory cell 10', low and high level signals should be applied from the terminals IN, $\overline{IN}$ through the transfer gates 19, 19', respectively which are enabled by the writing signal W. As a result, potentials at the nodes 1, 2 are varied by the signals IN and $\overline{IN}$ and become low and high levels, respectively. This eliminates a need to increase the transconductance Gm of the MOST's $Q_{11}$, $Q_{12}$, as well as reducing the power consumption of the amplifier 12 as compared with the circuit required to perform FIG. 1. In addition, the period of a write operation is shortened.

Figure 7:
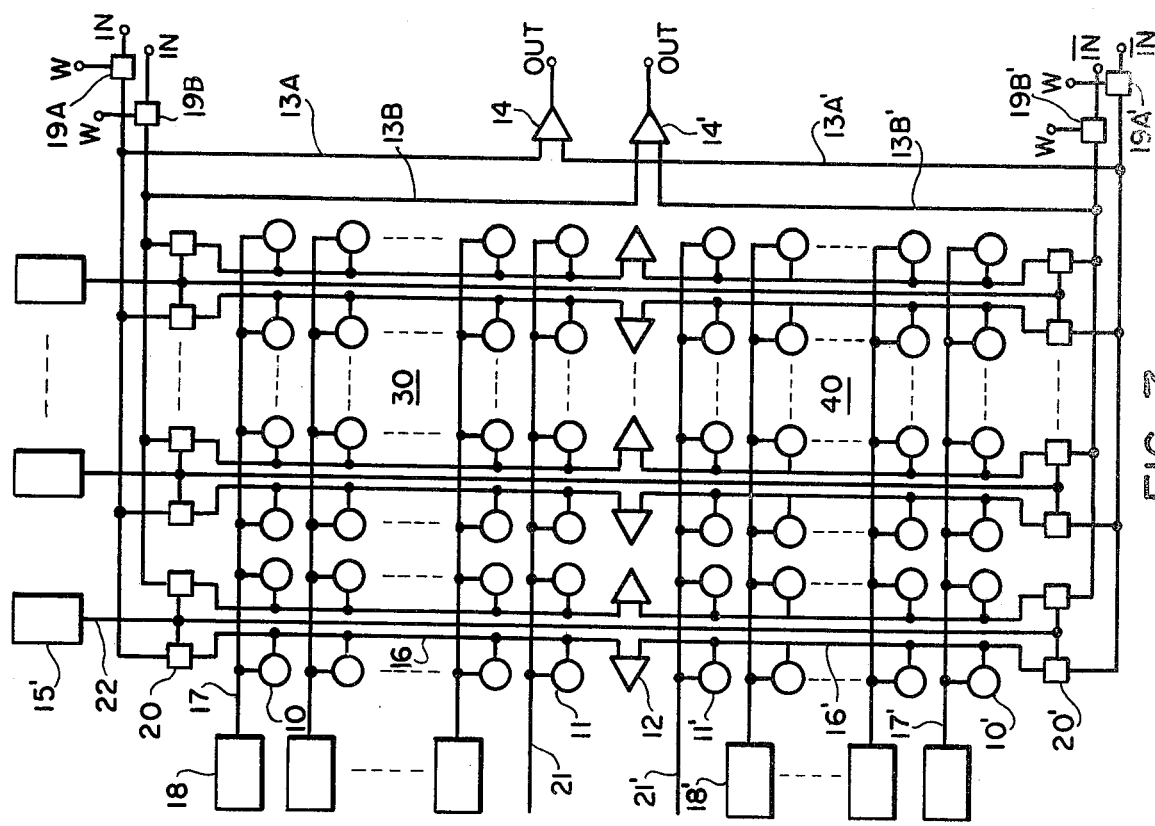
FIG. 7 is a block diagram of another embodiment of the invention

FIG. 7 shows another embodiment of the invention. The same component elements are indicated by the identical reference numericals in FIG. 4 and 7. In this embodiment, a single decoder 15' is used for selecting the bit lines of the adjoining columns. Thirty-two column decoders 15' are provided in the 64 × 64 bit array, and 4 switching gates 20, 20' connected to the bit lines of the adjoining columns, are simultaneously controlled by an output 22 of a single column decoder 15'. For selecting two column lines with a single column decoder, the I/O buses 13, 13', as shown in FIG. 4, are divided into I/O buses 13A, 13B, and I/O buses 13A', 13B'. In other words, the bit lines 16, 16' on an odd number of columns are connected through the gates 20, 20', on the same column, to the I/O buses 13A, 13A', respectively. Similarly, bit lines 16, 16', on an even number of columns, are connected through the gates 20, 20' on the same column to the I/O buses 13B, 13B', respectively. In addition, two output amplifiers 14, 14', are provided and a pair of I/O buses 13A, 13A', connected to an odd number of bit lines, are applied to the output amplifier 14 as two inputs, while the pair of I/O buses 13B, 13B', connected to an even number of bit lines, are applied to the output amplifier 14' as two inputs.

Write gates 19A, 19A' are provided for supplying the I/O buses 13A, 13A' with input signals IN, $\overline{IN}$ therethrough, respectively. On the other hand, write gates 19B, 19B' are provided for supplying the I/O buses 13B, 13B' with input signals IN, $\overline{IN}$ therethrough, respectively.

In the embodiment shown in FIG. 4, one of the $2^6$ (=64) column lines are selected by 6 address signals to be fed to the column decoder 15. In this embodiment, 5 address signals are fed to the column decoder 15', to select one of the $2^5$ (=32) pairs of column lines, while another one of the address signals is used to select one of the outputs of the amplifiers 14, 14', thereby achieving a high speed memory circuit, like the embodiment of FIG. 4. In the case of the write operation, either pair of gates 19A, 19A' or 19B, 19B' are selected by the aforesaid single address signal, and then the complementary input signals IN, $\overline{IN}$ are applied through the selected pair of gates to the I/O bus lines. Therefore a stable memory circuit is achieved as mentioned in the description of FIG. 4. The other circuit arrangement and connections are the same as those in the embodiment of FIG. 4.

Figure 8:
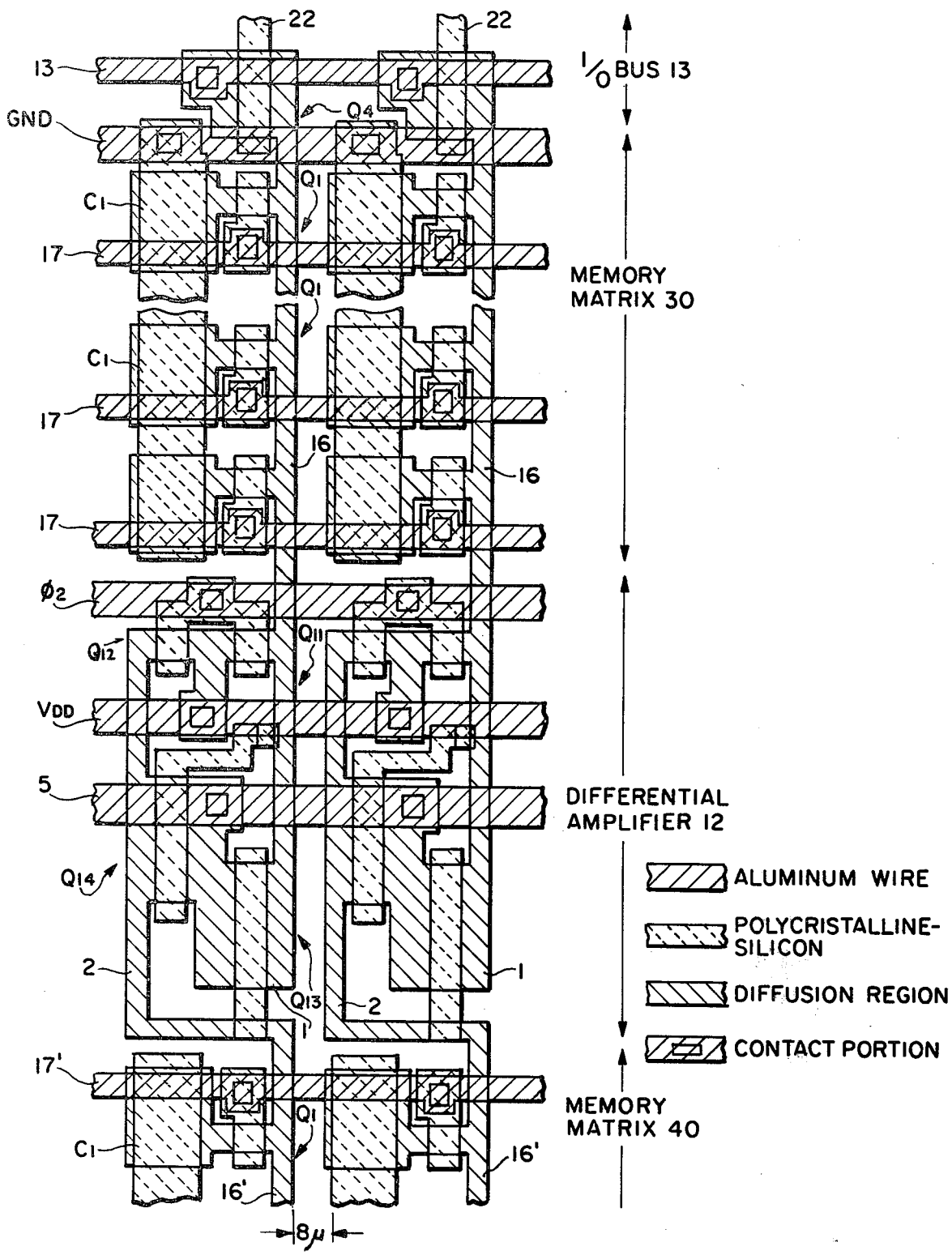
FIG. 8 shows an integrated arragement of the block diagram of FIG. 1
Figure 9:
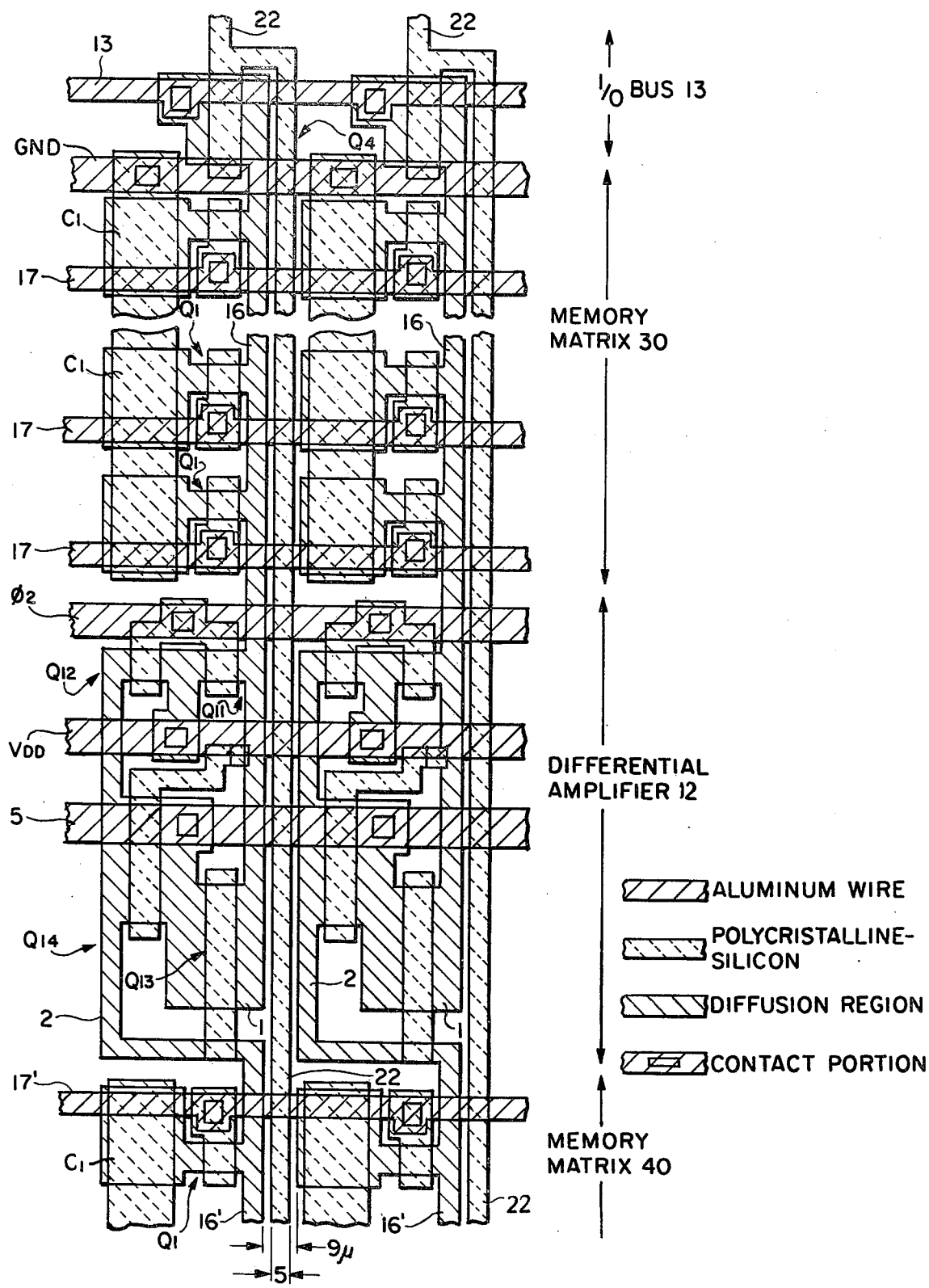
FIG. 9 shows an integrated arrangement of the block diagram of FIG. 4.
Figure 10:
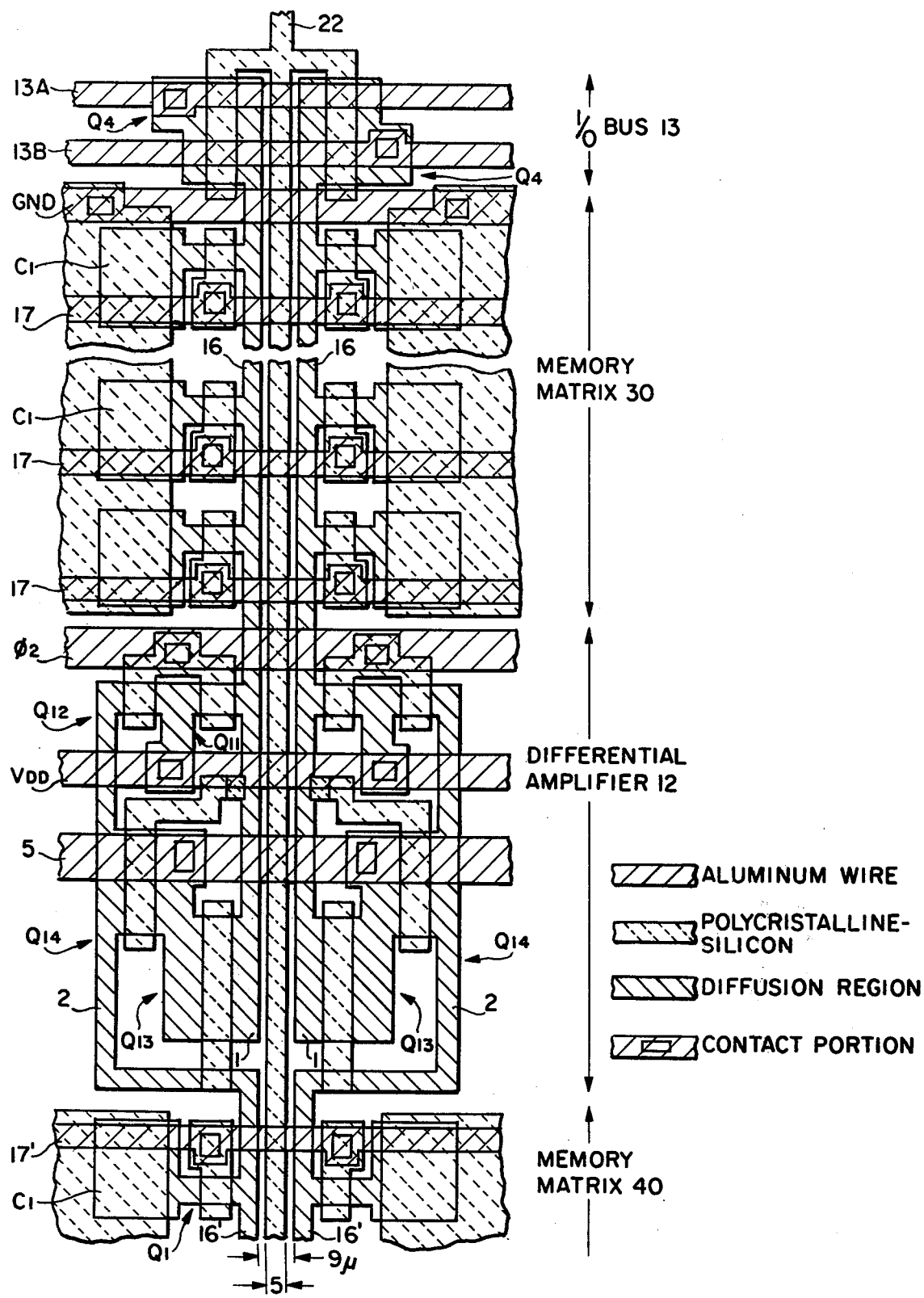
FIG. 10 shows an integrated arrangement of the block diagram of FIG. 7.

FIGS. 8, 9, 10 show portions of integrated circuit arrangements for the conventional circuit shown in FIG. 1, the circuit of the first embodiment of the invention shown in FIG. 4 and the circuit of the second embodiment shown in FIG. 7, respectively. The respective circuits are formed as an integrated circuit on a semiconductor chip by the known technique of MOS semiconductor integrated circuit fabrication. In this case, the gates of the MOST's utilized in the circuit are made of polycrystalline silicon. The same parts are indicated by identical reference numericals throughout FIGS. 8, 9 and 10. The transistors $Q_{15}$ for energizing the differential amplifier 12, are integrated into a single MOST (not shown), and hence the sources of the switching transistors $Q_{13}$, $Q_{14}$ are connected to the drains of MOST $Q_{15}$ though an aluminum line 5, thereby reducing the chip area. In the prior art arrangement of FIG. 8, the spacing between two adjacent bit lines, formed by the diffused regions 16 (16') in the semiconductor chip, should be at least 8$\mu$ for insulation between the two regions. Accordingly, respective columns are spaced 8$\mu$.

In the first embodiment of the invention, as shown in FIG. 9, a decoder output line formed by the poly-silicon layer 22 on the semiconductor chip is arranged between the two adjacent bit lines 16 (16'). Accordingly, each of the spacing therebetween may be only 2$\mu$. In addition, the minimum width of a poly-silicon layer may be at least 5$\mu$, and hence the spacing between columns is 9$\mu$, leaving only an increase of 63$\mu$ in total, on comparison with the integrated circuit shown in FIG. 8.

In the second embodiment shown in FIG. 10, the decoder output line formed by the poly-silicon layer 22 is arranged between the two adjacent bit lines 16 (16'). Accordingly, the spacing between the column lines is 9$\mu$ as in the case of FIG. 9. In this case, one decoder output line 22 is provided for every two columns, thus resulting in an increase of 31$\mu$ in total.

As is apparent from the foregoing, the memory circuit according to the present invention avoids the shortcomings experienced with the prior art circuits, with only a minor increase in semiconductor chip area.

Although a specific embodiment of this invention has been shwon and described, it will be understood that various modifications may be made without departing from the spirit of this invention.

What is claimed is:

1. A memory circuit comprising: memory cells comprised of a single field-effect transistor and a storage capacitor, said memory cells being arranged in an array of rows and columns and being divided into first and second row groups; differential amplifiers each having a first input terminal connected to the memory cells belonging to said first row group and also connected to each column, and a second input terminal connected to the memory cells associated with said second row group and also connected to the same column as the column connected to said first input terminal; common cross-coupled amplifier having first and second input terminals; a plurality of first and seconed means associated with the respective columns, said first means operatively connecting the first input terminal of a selected differential amplifier to the first input terminal of said cross-coupled amplifier, said second means associated with the same column as that associated with said first means operatively connecting the second input terminal of said selected differential amplifier to the second input terminal of said cross-coupled amplifier; and means for controlling said first and second connecting means; whereby said first and second connecting means associated with the same column are controlled by the same controlling means.

2. A memory circuit comprising: memory cells arranged in an array of rows and columns, said memory array being divided into first and second row groups; a plurality of differential amplifiers each having a first input terminal connected to the memory cells associated with said first row group and also connected to each column, and a second input terminal connected to the memory cells associated with said second row group and also connected to the same column as the column connected to said first input terminal; first and second input-output bus lines; a plurality of first and second means associated with the respective columns, said first means operatively connecting the first input terminals of a selected differential amplifier to said first input-output bus line, said second means associated with the same column as that associated with said first means, operatively connecting the second input terminal of said selected differential amplifier to said second input-output bus line; means for controlling said first and second connecting means, said first and second connecting means associated with the same column being controlled by the same controlling means; a common cross-coupled amplifier connected to said first and second input-output bus lines, and means for simultaneously supplying said first input-output bus line with one of a logic "1" and "0" signal and said second input-output bus line with the other of said logic "1" and "0" signal at the time said memory circuit is enabled in a write-operation mode.

3. A memory circuit comprising;
memory cells arranged in an array of rows and columns and divided into first and second row groups and first and second column groups, said memory cells forming a plurality of pairs of adjacent columns of said first and second column groups;
a plurality of first sense amplifiers each having a first input terminal connected to the memory cells associated with said first row group and said first column group and a second input terminal connected to the memory cells associated with said second row group and said first column group;
a plurality of second sense amplifiers each having a first input terminal connected to the memory cells of said first row group and said second column group and a second input terminal connected to the memory cells of said second row group and said second column group;
first and second common output amplifiers each having first and second input terminals; a plurality of first connecting means for connecting the first input terminal of each of the first sense amplifiers to the first input terminal of said first output amplifier;
a plurality of second connecting means for connecting the second input terminal of each of the first sense amplifiers to the second input terminal of said first output amplifier;
a plurality of third connecting means for connecting the first input terminal of each of the second sense amplifiers to the first input terminal of said second output amplifier;
a plurality of fourth connecting means for connecting the second input terminal of each of the second sense amplifiers to the second input terminal of said second output amplifier, and;
a plurality of controlling means associated with each of said pairs of adjacent first and second group columns for simultaneously controlling said first, second, third, and fourth connecting means associated with the same pair of adjacent first and second group columns.

4. The memory circuit of claim 3, wherein each of said memory cells is comprised of a single field-effect transistor and a storage capacitor.

5. A memory circuit comprising:
memor cells comprised of a single field-effect transistor and a storage capacitor, said memory cells arranged in an array of rows and columns and divided into first and second row groups;
sense amplifiers, each having a first input terminal connected to the memory cells associated with said first row group and also connected to each column, and a second input terminal connected to the memory cells associated with said second row group and also connected to the same column as that connected to said first row input terminal;
an output amplifier having first and second input terminals;
an output amplifier having first and second input terminals;
first and second bus lines arranged substantially in parallel with said first row group and said second row group respectively and connected to said first and second input terminals of the output amplifier respectively;
a plurality of first and second gating means arranged at respective cross-points between said columns and said first and second bus lines for operatively connecting said columns in said first and second row groups to said first bus line and to said second bus line respectively; and
a plurality of control lines each connected to control terminals of said first and second gating means associated with the same column, said control lines being arranged substantially in parallel with and adjacent to the same column.

6. An integrated memory circuit comprising:
a semiconductor chip;
memory cells included in said semiconductor chip and arranged in an array of rows and columns, said memory cells being divided into a plurality of groups;
a plurality of sense amplifiers connected to the memory cells of the respective groups;
a least two data bus lines;
a plurality of connecting gates, each having a control terminal, said gates for connecting the sense amplifiers to said data bus lines in response to a single on said control terminal; and a plurality of control lines, each coupled with said control terminal, said semiconductor chip having a plurality of elongated surface regions arranged in parallel with each other, each of said elongated surface regions being occupied by the memory cells of the respective groups, the sense amplifiers being connected to the memory cells and the connecting gates associated with the sense amplifiers, and said control line extending between the adjacent elongated surface regions.

* * * * *

UNITED STATES PATENT OFFICE
CERTIFICATE OF CORRECTION

Patent No. 4,125,878       Dated November 14, 1978

Inventor(s) Hiroshi Watanabe

It is certified that error appears in the above-identified patent and that said Letters Patent are hereby corrected as shown below:

In Claim 5, line two "memor" should read --memory--;

In Claim 6, line 9, "a" should read --at--;

In Claim 6, line 12, "single" should read --signal--

*Signed and Sealed this*

*Twentieth* Day of *February 1979*

[SEAL]

Attest:

RUTH C. MASON
*Attesting Officer*

DONALD W. BANNER
*Commissioner of Patents and Trademarks*